United States Patent [19]

Dormidontov et al.

[11] 4,140,142
[45] Feb. 20, 1979

[54] SEMICONDUCTOR PHOTOELECTRIC GENERATOR

[76] Inventors: Anatoly A. Dormidontov, ulitsa Marii Ulyanovoi, 11, kv. 93, Moscow; Evgeny M. Zykov, ulitsa Schorsa, 5, kv. 28, Ivanteevka Moskovskoi oblasti; Tatyana A. Litsenko, Trubnaya ulitsa, 11, kv. 12; Boris A. Nikitin, ulitsa Plescheeva, 7, kv. 214, both of Moscow; Vladimir I. Polyakov, ulitsa Mossoveta, 40, kv. 19, Kosino Moskovskoi oblasti; Dmitry S. Strebkov, Kirovogradsky proezd, 3, korpus 1, kv. 17, Moscow; Vadim A. Unishkov, ulitsa Bazhova, 15, korpus 1, kv. 142, Moscow; Vyacheslav V. Chernyshov, ulitsa Molostovykh, 4, korpus 1, kv. 49, Moscow, all of U.S.S.R.

[21] Appl. No.: 785,045

[22] Filed: Apr. 6, 1977

[51] Int. Cl.$^2$ .......................................... H01L 31/06
[52] U.S. Cl. ............................. 136/89 PC; 136/89 SJ; 357/30
[58] Field of Search .................. 136/89 PC, 89 SJ; 350/293

[56] References Cited

U.S. PATENT DOCUMENTS

| | | | |
|---|---|---|---|
| 2,904,612 | 9/1959 | Regnier | 136/89 |
| 3,018,313 | 1/1962 | Gattone | 136/89 |
| 3,229,682 | 1/1966 | Perlmutter et al. | 126/270 |
| 3,427,200 | 2/1969 | Lapin et al. | 136/89 |
| 3,615,853 | 10/1971 | Goldsmith et al. | 136/89 |
| 3,653,971 | 4/1972 | Lidorenko et al. | 136/89 SJ |
| 3,899,672 | 8/1975 | Levi-Scotti | 350/293 |
| 3,923,381 | 12/1975 | Winston | 350/293 |
| 3,977,904 | 8/1976 | Köhler | 136/89 |
| 3,985,116 | 10/1976 | Kapany | 126/270 |
| 4,029,519 | 6/1977 | Schertz et al. | 136/89 PC |
| 4,042,417 | 8/1977 | Kaplow et al. | 136/89 PC |
| 4,058,110 | 11/1977 | Holt | 126/271 |

OTHER PUBLICATIONS

R. I. Frank et al., "Improved Performance of Solar Cells For High Intensity Applications," *Conf. Record, 12th IEEE Photovoltaic Specialists Conf.*, Nov. 1976.
R. J. Soukop, "High Voltage Vertical Multijunction Solar Cell," *J. Appl. Physics*, vol. 47, pp. 555–559, (1976).
Anonymous, "Sun-Tracking 'Eyeballs' Produce Electricity, and 20% Conversion Efficiency Is Predicted," *Electrotechnology*, Oct. 1976, p. 16.

*Primary Examiner*—John H. Mack
*Assistant Examiner*—Aaron Weisstuch
*Attorney, Agent, or Firm*—Lackenbach, Lilling & Siegel

[57] ABSTRACT

A semiconductor photoelectric generator, for converting radiation energy from a source, for example, the sun, into electric energy, comprises a matrix of photo electric converters made of a semiconductor material. Each photoelectric converter is doped to form a P-N junction and an isotype junction. Current-collecting conductors are connected to a base region and to an alloy region. An operating surface of the semiconductor photoelectric generator is secured by a translucent adhesive layer to a coating exposed directly to radiation from a radiation source. The coating is composed of optical concentrators which focus the radiation energy in a focal spot and are disposed on the operating surface so that the absorption band of the focussed radiation in the focal spot is located in the base region and is spaced from the P-N junction by a distance not exceeding the diffusion length of the minority carriers in the base region.

1 Claim, 9 Drawing Figures

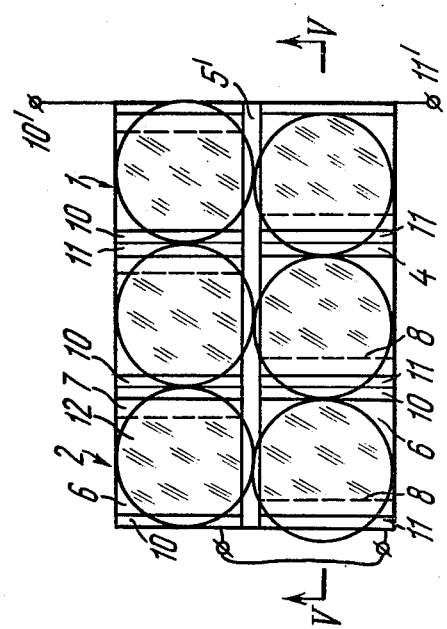
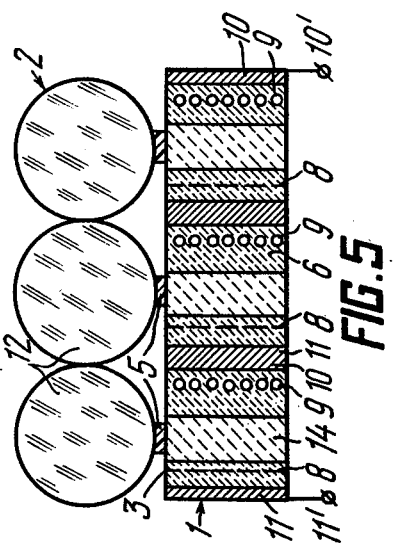
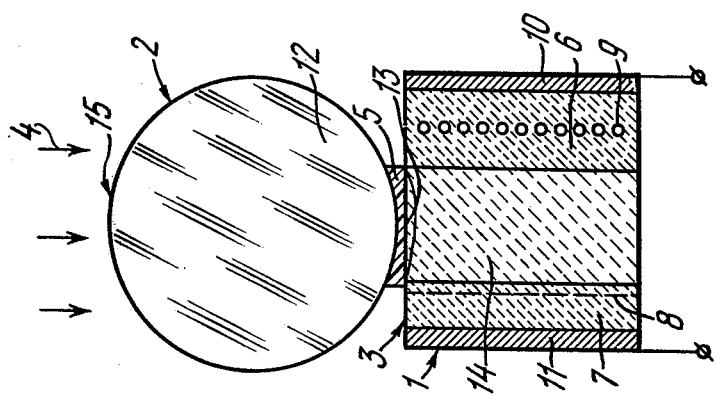

SEMICONDUCTOR PHOTOELECTRIC GENERATOR

FIELD OF THE INVENTION

The present invention relates to devices for the conversion of radiant energy into electric energy and, more specifically, to semiconductor photoelectric generators which are used for making solar cells for space vehicles and for ground power generating equipment.

DESCRIPTION OF THE PRIOR ART

There exists a semiconductor photoelectric generator (U.S. Pat. No. 3,653,971, cl. 136—89) in the form of a solid-state matrix made from photoelectric converters. Each converter has a P-N junction. Each photoelectric converter is a parallelepiped which is doped to produce a P-N junction serving as a rectifying barrier that separates a base region of the same type of conduction from an inversion region of the opposite type of conduction. The base region also has an isotype $P-P^+$ junction if it has P-type conduction, or an isotype $N-N^+$ junction if it has N-type conduction.

Metallic conductors are connected to the base region and to the inversion region, which in this case is obtained by doping and, therefore, is an alloy layer. The thickness of the base region is approximately equal to the diffusion length of the minority carriers in the base region which provides for the most complete collection of the minority carriers moving in the direction of the P-N junction. The thickness of the alloy region is hundreds of times smaller than the width of the base region.

The above photoelectric converters, united into a solid-state matrix by metallic conductors connected to the base region and to the alloy region, can also be fabricated as microminiature parallelpipeds. Metallic conductors are also disposed on all the side faces of the microminiature parallelepipeds when the base region is disposed in the depth of a photoelectric converter, the alloy regions occupying four side faces of this microminiature parallelepiped. These faces make an angle with the operating surface of the semiconductor photoelectric generator exposed to incident radiation.

The planes of the P-N junctions are located on one, two three, four or five faces of a parallelepiped, and the width of the bottom length of each microminiature parallelepiped is approximately equal to the diffusion length of the minor carriers in the base region. The conductors of such semiconductor photoelectric generators have negligible resistance (of about thousandths of an Ohm) due to the small leakage resistance of the alloy region.

There also exists a semiconductor photoelectrical generator (U.S. application Ser. No. 519,697 filed Oct. 31, 1974, now U.S. Pat. No. 3,948,682) which comprises a plurality of electrically-connected photoelectric converters. Each converter has P-N junctions and isotype junctions in the base region. The isotype junctions are disposed in the immediate proximity of the operating surface of the semiconductor photoelectric generator, and the P-N junctions are spaced from the operating surface at a distance not exceeding the diffusion length of the minority carriers in the base region. The efficiency of such a semiconductor photoelectric generator is increased due to the reduced power losses caused by the leakage resistance of the base region and the resistance of the conductors. However, it becomes feasible to reduce the leakage resistance in the base region and conductor resistance only if at least two linear dimensions of a microminiature photoelectric converter are approximately equal to the diffusion length of the minority carriers in the base region.

Also known in the art is a semiconductor photoelectric generator (U.S. Pat. No. 2,222,788, cl. 136—89) embedded in a translucent body of, for example, methyl methacrylate which completely seals the photoelectric converters from elemental attack and which can also form an optical lens focusing incident radiation, due to which the power output of the semiconductor photoelectric generator is increased.

A disadvantage common to all these known semiconductor photoelectric generators is low efficiency (1 to 3 percent) because of recombination of minority carriers in the base region on the side faces of the photoelectric converters and on the operating surface carrying current conductors, and also because of a low density of the radiant flux.

The maximum efficiency of known semiconductor photoelectric generators is attained when the width of the base region is approximately equal to the diffusion length of the minority carriers in the base region. Since the number of electron-hole pairs that are generated under the effect of radiation incident in a direction parallel with the P-N junction plane is the same at each point of the operating surface of the semiconductor photoelectric generator, it has been found that if the width of the base region is optimal and approximately equal to the diffusion length of the minority carriers in the base region, about 50 percent of the light-generated electron-hole pairs are separated by the P-N junction and become a useful current component, while the remaining 50 percent are recombined on the conductor to the base region.

SUMMARY OF THE INVENTION

It is an object of the invention to provide a semiconductor photoelectric generator which has a greater efficiency of radiant energy-to-electric energy conversion and a higher power output per unit surface at high radiation densities.

In accordance with this and other objects, the invention consists of a semiconductor photoelectric generator which comprises at least one photoelectric converter having at least one rectifying barrier that separates a base region of the same conduction type provided by majority carriers in the base region from at least one alloy region of the opposite type of conduction provided by the minority carriers in the base region. The generator also has at least two current conductors, one connected to the base region and the other to the alloy region. A coating exposed directly to the incident radiation is disposed on at least one operating surface of the semiconductor photoelectric generator which receives radiation through the coating. The coating, according to the invention, is made in the form of at least one optical concentrator that focusses radiation energy and directs at least the portion of the radiation spectrum which is photoactive for this photoelectric converter, onto the operating surface of the semiconductor photoelectric generator, the absorption band of radiation focussed in the focal spot being located in the base region of the photoelectric converter and being spaced from the rectifying barrier by a distance less than the diffusion length of the minority carriers in the base region.

It is preferable that a semiconductor photoelectric generator comprises at least one photoelectric converter with at least two linear dimensions approximately equal to the diffusion length of the minority carriers in the base region. Each optical concentrator should have at least one linear dimension, as measured in a direction parallel to the operating surface of the semiconductor photoelectric generator, approximately equal to the diffusion length of the minority carriers in the base region.

It is advantageous that a semiconductor photoelectric generator have at least one rectifying barrier of each photoelectric converter lying in a plane normal to the operating surface. Optical concentrators should be made in the form of cylindrical rods which are parallel to the rectifying barrier plane normal to the operating surface.

It is also preferable that a semiconductor photoelectric generator comprise one photoelectric converter with at least one rectifying barrier whose plane is normal to the operating surface of the semiconductor photoelectric generator. The coating can be fabricated in the form of one optical concentrator made as a sphere.

It is desirable that a semiconductor photoelectric generator comprise at least two photoelectric converters with the plane of a rectifying barrier normal to the operating surface of the semiconductor photoelectric generator. Optical concentrators can be made in the form of spheres arranged in one layer, each photoelectric converter corresponding to one sphere. The spheres are interconnected at contact points.

It is advantageous that a semiconductor photoelectric generator optical concentrators be made in the form of photocones each of which are a mirror reflecting system with a reflecting surface formed by rotation of a parabola section about an axis of rotation aligned with the optical axis of the photocone which is normal to the operating surface of the semiconductor photoelectric generator, each photoelectric converter corresponding to a separate photocone.

It is highly desirable that a semiconductor photoelectric generator comprise photoelectric converters with their rectifying barrier normal to the operating surface. Optical concentrators can be made in the form of photowedges, each of which are a reflecting system in which one part of the reflecting surface is formed by the forward motion of a parabola section along a direction parallel to the rectifying barrier plane, and the other part is a reflection of the first part of the reflecting surface symmetrical with respect to the optical plane of the photowedge. The optical plane of the photowedge is normal to the operating surface of the semiconductor photoelectric generator.

It is also preferable that a semiconductor photoelectric generator comprise at least one photoelectric converter with the width of its base region approximately equal to the average depth of absorbed radiation quanta, and with the plane of its rectifying barrier parallel to the operating surface. A coating can be composed of n optical concentrators, each of which have at least one linear dimension of the focal spot approximately equal to the diffusion length of the minority carriers in the base region. A current conductor to the base region can be made in the form of ribbons attached to the operating surface at places free from the focal spots.

The embodiment of the semiconductor photoelectric generator in accordance with the present invention makes it possible to enhance the conversion efficiency and the sensitivity of the semiconductor photoelectric generator.

BRIEF DESCRIPTION OF THE DRAWINGS

These and other objects and advantages of the present invention will be best understood from the following description of preferred embodiments thereof when read in connection with the accompanying drawings, in which:

FIG. 3 is an elevational end view of another embodiment of a semiconductor photoelectric generator;

FIG. 4 is a top view of the embodiment of a semiconductor photoelectric generator shown in FIG. 3 according to the invention;

FIG. 5 is a cross-sectional view taken along the line V—V in FIG. 4, according to the invention;

DETAILED DESCRIPTION OF THE INVENTION

Figure 1:
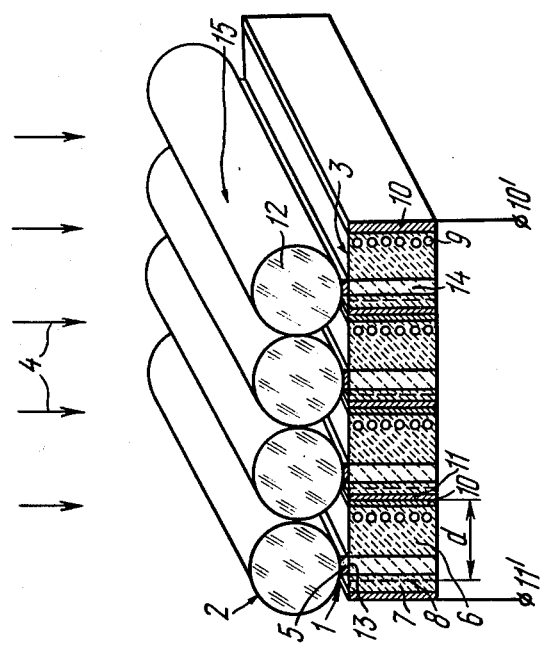
FIG. 1 is a perspective general view of a semiconductor photoelectric generator, according to the invention.

Referring to FIG. 1, there is shown a semiconductor photoelectric generator comprising photoelectric converters 1 with a coating 2.

An operating surface 3 of the semiconductor photoelectric converter is exposed to incident radiation 4 passing through the coating 2 and is coated with a translucent adhesive layer 5 of, for example, rubber, which is applied onto the operating surface at places where the coating 2 is in contact with the photoelectric converters 1 and which secures the coating 2 to the converters 1.

The photoelectric converters 1 are fabricated from a semiconductor material, for example, silicon, and are united into a solid-state matrix. Each photoelectric converter 1 has a base region 6 of P-type condition provided by "holes" which are majority carriers for the base region 6. The base region 6 is doped with phosphorus so as to form an alloy region 7 of N-type conduction provided by electrons which are majority carriers for the alloy region 7. The same electrons are minority carriers in the base region 6.

The boundary between the alloy region 7 and the base region 6 is a P-N junction 8. The base region 6 on the opposite side of the P-N junctions 8 is doped with boron to form a P-P$^+$ isotype junction 9 which serves to reduce contact resistance between a current conductor 10 in the base region 6 and the base region 6, and also for repelling electrons towards the P-N junction 8.

A current conductor 11 connected to the alloy region 7 is continuous throughout the surface and when the photoelectric converters 1 are united into a matrix, it is connected to the conductor 10 of the base region 6. For this reason, the leakage resistance in the alloy region 7 may be neglected.

The coating 2 is made in the form of optical concentrators 12 arranged in one layer on the operating surface 3 of the semiconductor photoelectric generator. As the radiation 4 passes through any of the optical concentrators 12, the concentrator focuses the radiation 4 to a focal spot 13. The radiation 4 focussed in the focal spot 13 is absorbed in an absorption band 14 in the base region 6. The dimensions of the optical concentrators 12 and their arrangement on the operating surface 3 are such that the distance from the P-N junction 8 to the absorption band 14 is less than the diffusion length L of the minority carriers in the base region 6. The optical concentrators 12 are interconnected throughout the operating surface 3 of the semiconductor photoelectric generator by the translucent adhesive layer 5.

The semiconductor material selected for the base region 6 of the photoelectric converter 1 is a material with a long diffusion length L of the minority carriers in the base region 6, for example, about 100μ for silicon. To secure complete collection of the light-excited minority carriers generated in the base region 6 as they move towards the P-N junction 8, the thickness of the base region 6 should not exceed the diffusion length L of the minority carriers in the base region and is practically equal to the thickness of the photoelectric converter 1.

The semiconductor photoelectric generator operates as follows.

The light-exposed surface 15 of the coating 2 is subjected to the effect of radiation 4, shown as a series of parallel lines. The coating 2 is made of the optical concentrators 12 which concentrate the light 4 in the focal spots 13 and which are disposed so that the distance from any point of the absorption band 14 absorbing the radiation 4 focussed in the focal spot 13 to the respective P-N junctions 8 of the same photoelectric converters 1, is smaller than the diffusion length L of the minority carriers in the base region 6 of the photoelectric converters 1.

A higher efficiency of such a semiconductor photoelectric generator, as compared with known semiconductor photoelectric generators, is attained because of the fact that the distance from the minority carrier generation region, i.e., from the absorption band 14 absorbing the radiation 4 to the P-N junction 8, is less than the diffusion length L of these carriers and all the light-excited carriers reach the P-N junction 8.

This causes an increase of the voltage taken off current-collecting leads 10' and 11' connected, respectively, to the conductors 10 and 11 disposed on the outer sides of the photoelectric converters 1.

Since the photoactive portion of the radiation 4 is absorbed in the base region 6 in the immediate proximity of the P-N junction 8, losses due to the volume and surface recombination of the minority carriers are reduced, the efficiency of collection of the minority carriers moving towards the P-N junction 8 is enhanced, and the efficiency of the semiconductor photoelectric generator increases.

Figure 2:
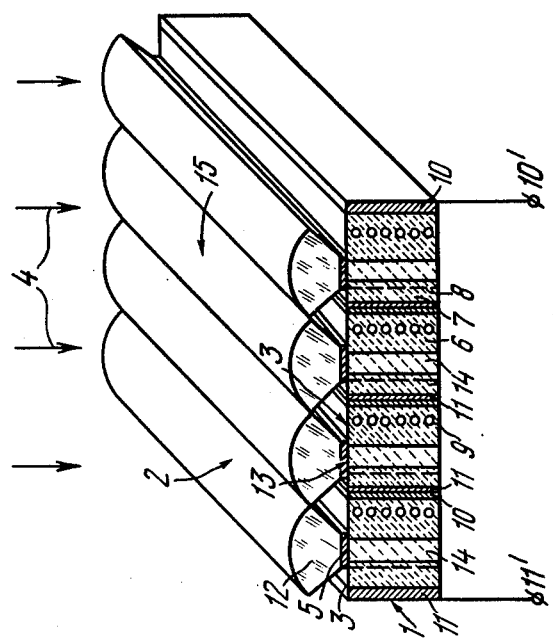
FIG. 2 is a perspective general view of another embodiment of a semiconductor photoelectric generator, according to the invention.

In the embodiment of FIG. 2, a semiconductor photoelectric generator has the coating 2 for concentrating the radiation 4 made in the form of cylindrical glass rods, the diameter of each rod being approximately equal to the width d of the base region 6. The cylindrical rods are parallel to the planes of the P-N junctions 8 of the photoelectric converters 1. The coating is attached onto the operating surface 3 of the semiconductor photoelectric generator by the radiation-translucent adhesive layer 5 of, for example, rubber.

The efficiency of the semiconductor photoelectric generator with a coating made in the form of cylindrical rods is approximately equal to the efficiency of the generator described above.

FIG. 3 illustrates a semiconductor photoelectric generator which comprises the photoelectric converter 1 with the P-N junction 8 and the isotype junction 9, wherein the optical concentrator 12 for the radiation 4 is fabricated in the form of a sphere. Such a design of the semiconductor photoelectric generator will make it possible to provide the photoelectric converter 1 with the P-N junctions 8 on its four side faces which will considerably increase the voltage density obtained from the semiconductor photoelectric generator and the efficiency of the generator.

The embodiment of a semiconductor photoelectric generator illustrated in FIG. 3 helps increase appreciably the light-exposed surface 15 due to larger sphere dimensions which results in the concentration of the radiation 4 and cuts down the cost of power generation on the semiconductor photoelectric generator.

FIGS. 4 and 5 illustrate another embodiment of a semiconductor photoelectric generator (top view and cross-sectional view, respectively) in which the coating 2 is composed of optical concentrators 12 in the form of spheres disposed on the operating surface 3 in one layer, each photoelectric converter 1 corresponding to one sphere. The photoelectric converters 1 are united into a matrix by means of current conductors 10 and 11 and a layer 5' of a dielectric adhesive substance which may be, for example, epoxy-based.

The photoelectric converters 1 are connected in series, which increase the power output of the semiconductor photoelectric generator. At the contact points, the spheres are joined in order to provide a mechanically strong coating.

Figure 6:
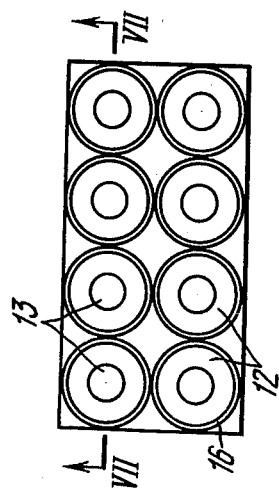
FIG. 6 is a top view of another embodiment of a semiconductor photoelectric generator, according to the invention.
Figure 7:
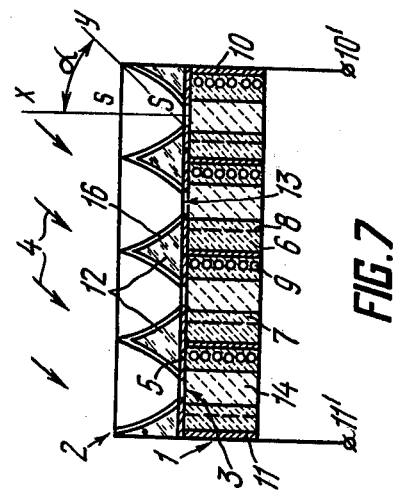
FIG. 7 is a cross-sectional view taken along the line VII—VII in FIG. 6, according to the invention.

FIGS. 6 and 7 show another embodiment of a semiconductor photoelectric generator (top view and side view, respectively) which has the coating 2 composed of the optical concentrators 12. Each optical concentrator 12 is a photocone. A photocone is a mirror reflecting system in which a reflecting surface 16 is formed by rotation of a parabola section around a pre-oriented axis X of rotation which makes an angle α with an optical axis Y of the parabola. The optical axis Y of the parabola coincides with a straight line connecting the edge of an inlet port S of the photocone with the edge of an outlet port S.

The reflecting surface 16 of the photocone is a thin layer of metal, for example, aluminum, deposited by sputtering on a glass substrate. The optical axis of the photocone is normal to the operating surface 3. The photocone is secured to the operating surface 3 by the translucent adhesive layer 5. The focal spot 13 of the photocone is located in the base region 6 (FIG. 7) of the photoelectric converter 1, and the reflecting surface 16 of the photocone is exposed to the radiation 4.

A peculiar feature of the photocone is its capability of concentrating the incident radiation 4 on its reflecting surface 16 within a parametric angle α into the focal spot 13 which makes it unnecessary to follow the source of the radiation 4, for instance, the sun, for a long period of time.

Each photocone is associated with one photoelectric converter 1 which makes it possible to dispose the P-N junctions 8 on four side faces of the photoelectric converter 1 and, consequently, to increase the efficiency of the semiconductor photoelectric generator.

Figure 8:
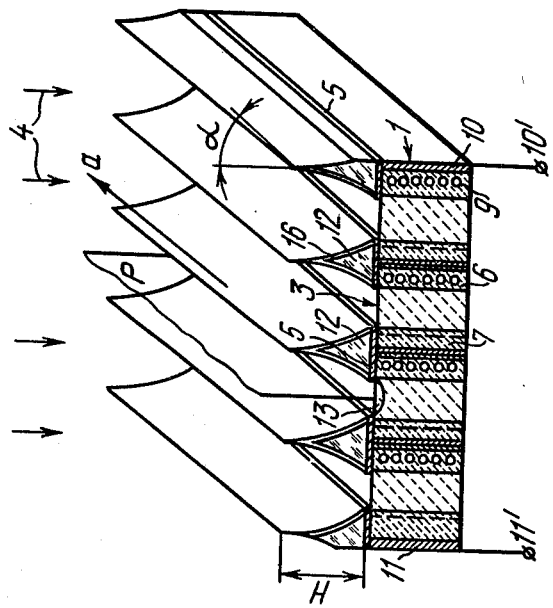
FIG. 8 is a perpsective view of another embodiment of a semiconductor photoelectric generator, according to the invention.

The embodiment of a semiconductor photoelectric generator shown in FIG. 8 has the optical concentrators 12 made in the form of photowedges.

A portion of the reflecting surface 16 of the photowedge is formed by the forward motion of a parabola section along a direction (see arrow a) parallel to the P-N plane of the junction 8 and the optical plane P of the photowedge. The other portion of the reflecting surface 16 of the photowedge is a mirror image of the first portion obtained as shown above. The reflecting surface 16 of the photowedge is a thin metal layer deposited on a glass substrate which is secured to the operating surface 3 by means of the adhesive layer 5. Similar to the photocone, the use of a photowedge is advantageous in that it obviates the necessity of orienting the optical concentrators 12 towards the source of the radiation 4 within the parametric angle α.

In this embodiment of a semiconductor photoelectric generator, the efficiency of the generator will be approximately equal to the efficiency of the semiconductor photoelectric generator illustrated in FIGS. 6 and 7.

Figure 9:
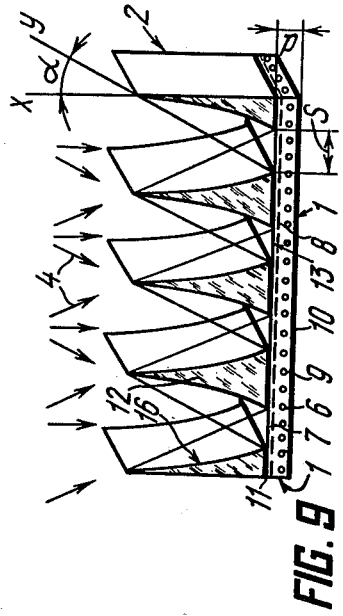
FIG. 9 is a perspective view of another embodiment of a semiconductor photoelectric generator, according to the invention.

FIG. 9 shows a semiconductor photoelectric generator which has the P-N junction 8 and the isotype junction 9 parallel to the operating surface 3 and the coating 2 is composed of four optical concentrators 12 made in the form of microminiature photowedges. The width of the outlet port S of the photowedge is approximately equal to the diffusion length L of the minority carriers in the base region 6, and the thickness d of the photoelectric converter 1 does not exceed the average radiation quanta absorption depth which is equal to tens of microns.

At a normal density of the radition 4 (about 1000W/m$^2$) the proposed semiconductor photoelectric generator works effectively irrespective of the fact whether the P-N junction 8 or the isotype junction 9 is exposed to light, since the coating 2 composed of photowedges and disposed on the operating surface 3 directs the entire incident radiation 4 onto the semiconductor photoelectric generator to the operating surface 3 free from the conductors 11 located on the operating surface 3 under the photowedges. This increases appreciably the current sensitivity of the semiconductor photoelectric generator.

At superhigh flux densities (above 50 W/cm$^2$) the leakage resistance in the alloy region 7 becomes particularly important. The leakage resistance is reduced considerably when the isotype junction 9 is exposed to light.

When the thickness d of the photoelectric converter 1 is approximately equal to the average absorption depth for the radiation 4, the entire energy coming to the operating surface 3 of the semiconductor photoelectric generator will be absorbed in the base region 6. Owing to this, the efficiency of the semiconductor photoelectric generator increases and remains at this level for radiation flux densities up to 1000 times the normal density and for linear rise of the current and power output.

In this design of the generator, the bottom of the photowedges is fabricated from some material of high heat conductivity, for example, copper. In this case, simultaneously with concentration of the radiation 4, the photowedge may function as a heat sink for sinking heat energy from the photoelectric converter 1 which is important for high-density solar radiation conversion.

In contrast to known designs of a semiconductor photoelectric generator, the present invention permits a substantial increase in the efficiency of the semiconductor photoelectric generator due to focussing and transmission of the radiation 4 to the most light-sensitive parts of the photoelectric converters 1, the use of the spectrum of the radiation 4 to maximum advantage, and to reduced current losses for the surface and volume recombination of the light-excited carriers. When the generator is exposed to concentrated solar radiation of a radiant flux density 1000 times as high as the normal level of 1000 W/m$^2$, leakage resistance losses in the alloy layer and in the base region 6 are so low that the semiconductor photoelectric generator has a linear relationship of the current and power output versus illumination and maintains a high efficiency at normal illumination levels.

Thus, it becomes feasible to use the proposed photoelectric generators in ground solar energy conversion installations with solar radiation concentrators. The cost of a unit power in such installations is decreased by approximately 1000 times which permits using semiconductor photoelectric generators not only for space, but also for ground power conversion applications.

What is claimed is:

1. A semiconductor photoelectric generator, comprising:
    at least one photoelectric converter for radiant-to-electric energy conversion;
    a coating passing to said photoelectric converter at least the part of the spectrum of said radiation which is photoactive for said photoelectric converter;
    an operating surface of said semiconductor photoelectric generator exposed to said radiation which has passed through said coating secured to said operating surface;
    a base region of said photoelectric converter of the same type of conduction provided by carriers which are majority carriers for said base region, said base region having a thickness which is approximately equal to the average depth of absorption of said radiation;
    at least one alloy region of said photoelectric converter of the opposite type of conduction provided by carriers which are majority carriers for said alloy region, said majority carriers of said alloy region acting as minority carriers for said base region;
    at least one rectifying barrier of said photoelectric converter which separates said base region from said alloy region, a plane of said at least one rectifying barrier being parallel with said operating surface of said semiconductor photoelectric generator;
    at least two current conductors connected to said photoelectric converter, one of said current conductors being connected to said base region and the other of said current conductors being connected to said alloy region;
    a light-exposed surface of said coating which directly receives said radiation;
    at least one optical concentrator constituting a part of said coating which focuses radiant energy and guides at least the part of said radiation spectrum which is photoactive for the photoelectric converter, onto said operating surface of this semiconductor photoelectric generator;

each said optical concentrator producing a focal spot in which said radiant energy is focused by said optical concentrator, at least one linear dimension of said focal spot of each said at least one optical concentrator being approximately equal to the diffusion length of said minority carriers in said base region; said current conductor to said base region being made in the form of ribbons which are secured to said operating surface at places free from said focal spot of said at least one optical concentrator; whereby an absorption band of said radiant energy is focused in said focal spot which is disposed in said base region of said photoelectric converter and spaced from said at least one rectifying barrier of said photoelectric converter at a distance smaller than the diffusion length of said minority carriers in said base region.

* * * * *